United States Patent
Andersson

(12) 
(10) Patent No.: US 6,326,856 B1
(45) Date of Patent: Dec. 4, 2001

(54) YIG OSCILLATOR WITH RESILIENT SUPPORT STRUCTURE

(75) Inventor: Ronny Andersson, Tullinge (SE)

(73) Assignee: Sivers IMA AB, Kista (SE)

( * ) Notice: Subject to any disclaimer, the term of this patent is extended or adjusted under 35 U.S.C. 154(b) by 0 days.

(21) Appl. No.: 09/599,923

(22) Filed: Jun. 22, 2000

(51) Int. Cl.$^7$ .................................................. H03B 5/18
(52) U.S. Cl. ............................. 331/68; 331/74; 331/96; 331/117 D
(58) Field of Search ...................... 331/68, 74, 96, 331/117 D

(56) References Cited

U.S. PATENT DOCUMENTS 3,576,503 * 4/1971 Hanson .................................... 331/96
5,428,324 * 6/1995 Andersson et al. ..................... 331/96
5,652,550 * 7/1997 Vig .......................................... 331/68

* cited by examiner

Primary Examiner—Siegfried H. Grimm
(74) Attorney, Agent, or Firm—Christie, Parker & Hale, LLP

(57) ABSTRACT

A YIG oscillator including a magnetic structure; an oscillator circuit board attached to the magnetic structure and carrying a YIG resonator positioned in an air gap of the magnetic structure; an interface circuit board including terminals for external connections, the interface circuit board supporting the magnetic structure by means of a resilient component attached to the interface circuit board; and a flexible circuit connected at one end to the oscillator circuit board and connected at the other end to the interface circuit board.

17 Claims, 7 Drawing Sheets

YIG OSCILLATOR WITH RESILIENT SUPPORT STRUCTURE

TECHNICAL FIELD

This invention relates generally to YIG oscillators, and more specifically to a YIG oscillator having a low Vibration Sensitivity.

TECHNICAL BACKGROUND

YIG oscillators are a favored form of fundamental electromagnetic energy generators at frequencies in the spectrum of about 1 GHz to about 100 GHz. A YIG oscillator is an oscillator comprising an yttrium iron garnet crystal, which when placed in saturating magnetic field oscillates to generate electromagnetic energy at frequencies related to the strength of the magnetic field. More particularly, the output of a YIG oscillator is linearly dependent on the magnetic flux density in an air gap of a magnetic structure where the YIG crystal is positioned. The magnetic flux density, in turn, is inversely proportional to the length of the air gap, provided that the rest of the parameters of the magnetic circuit are constant.

For example, a 10 GHz YIG oscillator having an air gap length of 1 mm will exhibit a 1 kHz frequency deviation for an air gap length displacement of 1 Angstrom (1E-10 m).

A YIG oscillator structure comprises a metal enclosure enclosing and carrying the electric and magnetic circuitry. The enclosure serves as electrical as well as mechanical interface. Consequently, an external mechanical vibration will propagate into the magnetic structure and affect the length of the air gap, and thus the frequency of the oscillator. Hence, YIG oscillators are sensitive to mechanical vibration and the vibration frequency will appear as a frequency modulation of the YIG oscillator frequency. The modulation frequency is equal to the vibration frequency and the frequency deviation is proportional to the vibration level in terms of g's [m/s$^2$] and the Vibration Sensitivity in terms of frequency deviation vs. vibration level [Hz/g]. Usually the vibration sensitivity is constant vs. vibration frequency superimposed by mechanical resonance peaks.

The YIG oscillator is a low phase-noise device tunable over wide frequency ranges. In applications where the YIG oscillator is used as a low phase-noise source in an environment where mechanical vibrations are present, low Vibration Sensitivity performance is crucial at least for a part of the vibration spectrum. Therefore, attempts have been made to reduce the Vibration Sensitivity of the YIG oscillator by providing different external resilient structures supporting the enclosure. The resilient structures are arranged so as to embody a mechanical filter between the external mechanic structure and the very YIG oscillator.

Hitherto this has typically been taken care of by the purchaser of the YIG oscillator, who has had to make an application specific solution. This, more or less inevitably, has resulted in comparatively large resilient structures. Consequently it is desirable to provide a complete YIG oscillator relieving the purchaser of his problem of resiliently supporting the YIG oscillator.

Additionally, the arrangement of an external resilient structure between the enclosure of the YIG oscillator and the external mechanical structure, gives rise to another problem. The problem relates to how to resiliently transmit the microwave output signal from the YIG oscillator to an external microwave circuit, which is supported by the external mechanic structure.

Another prior art solution to the problem of mechanical vibrations is disclosed in U.S. Pat. No. 5,652,550, where the YIG oscillator is enclosed and supported by an aerogel structure. A second outer enclosure is provided in order to hold the aerogel. Also this solution leads to an undesired size of the resulting device. Additionally, like the above described known resilient structures the solution according to U.S. Pat. No. 5,652,550 suffers from the lack of a resilient arrangement for transmitting the microwave output signal from the YIG oscillator to the external circuitry.

SUMMARY OF THE INVENTION

One object of this invention is to provide a YIG oscillator supported by a resilient structure reducing the Vibration Sensitivity yet being significantly smaller than the prior art arrangements and providing a solution to the problem of the transmission of the microwave output signal.

The object is achieved by a YIG oscillator according to the appended claims.

The YIG oscillator according to the invention, in a first aspect thereof, thus comprises a magnetic structure; an oscillator circuit board attached to said magnetic structure and carrying a YIG resonator positioned in an air gap of said magnetic structure; and an interface circuit board comprising terminals for external connections, said interface circuit board supporting said magnetic structure by means of a resilient means attached to said interface circuit board; and a flexible circuit connected at one end to the oscillator circuit board and connected at the other end to the interface circuit board.

In a second aspect of the invention, the YIG oscillator comprises an enclosure, a magnetic structure; an oscillator circuit board attached to said magnetic structure and carrying a YIG resonator positioned in an air gap of said magnetic structure; and an interface circuit board comprising terminals for external connections; said magnetic structure and said oscillator circuit board being enclosed by said enclosure, said interface circuit board supporting said enclosure, wherein said YIG oscillator further comprises a flexible circuit, extending through said enclosure and interconnecting said oscillator circuit board with said interface circuit board; and a resilient means comprising a resilient element enclosed by and attached to said enclosure and supporting said magnetic structure.

According to the present invention the YIG oscillator advantageously comprises an individual interface circuit board to which the external connections are made, a flexible circuit connecting the interface circuit board with the oscillator circuit board, and a resilient means supporting the magnetic structure and thus providing a suspension for the magnetic structure and thereby the YIG oscillator. In accordance with the invention the resilient support is provided between the interface circuit board and the magnetic structure, either as a direct link therebetween or indirectly, such as via an enclosure as defined in the second aspect of the invention. In either case the invention provides for mechanically connecting the interface circuit board in a rigid relation to an external mechanical structure, while achieving an arrangement for the magnetic structure, which is less sensitive to vibrations since it is resiliently rather than rigidly connected to the external mechanical structure.

The magnetic structure and the resilient means in conjunction forms a mechanical filter. The characteristics of such a filter can be chosen as required for a specific application.

In an advantageous embodiment, the resilient means comprises at least one resilient element consisting of a polymer, thereby being easily given appropriate characteristics in terms of elasticity modulus and absorption (hysteresis) defining the mechanical low pass filter resonant frequency (cut-off frequency).

In another advantageous embodiment of said polymer the Coefficient of Thermal Conductivity of the polymer of choice will relax thermal tensions and decrease thermal gradients in the magnet structure thus reducing or eliminating so called phase-pops, sudden mechanical relaxation phenomena due to thermal gradients and TCE (temperature coefficient) mismatch.

In another advantageous embodiment the polymer embeds at least a portion of said flexible circuit contributing to the characteristic impedance of a transmission line on the flexible circuit. The transmission line can be made a coplanar waveguide (CPW). In this case the width of the conductor spacing in the coplanar structure is made larger, less critical and easier to manufacture when the CPW transmission line is covered by the polymer, in particular if the polymer has a low microwave absorption and a relative dielectric constant higher than $e_r=1$.

Further objects and advantages of the present invention will be discussed below by means of exemplary embodiments.

BRIEF DESCRIPTION OF THE DRAWING

Exemplifying embodiments of the invention will be described below with reference to the accompanying drawings, in which:

FIGS. 1A–1F schematically show an embodiment of the YIG oscillator according to the present invention, wherein FIG. 1A is a side view, FIG. 1B is a view from above, FIG. 1C is a cross-sectional view along line A—A in FIG. 1A, FIG. 1D is a cross-sectional view along line B—B in FIG. 1B, FIG. 1E is a cross-sectional view along line C—C in FIG. 1B, and FIG. 1F shows a detail of the YIG oscillator;

DESCRIPTION OF EMBODIMENTS

Figure 1A:
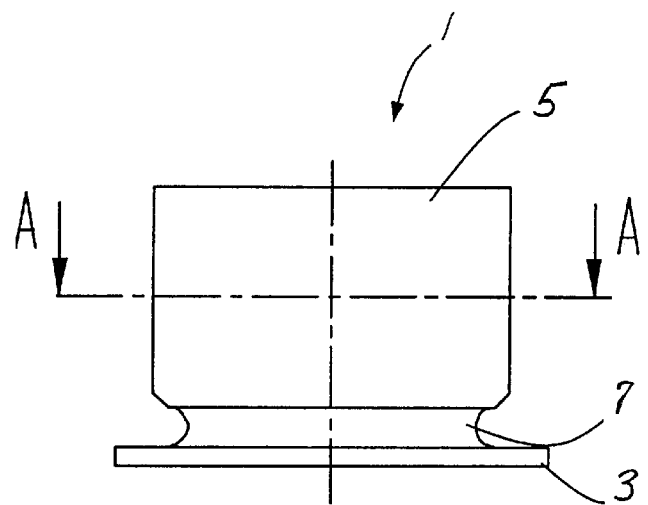
Figure 1B:
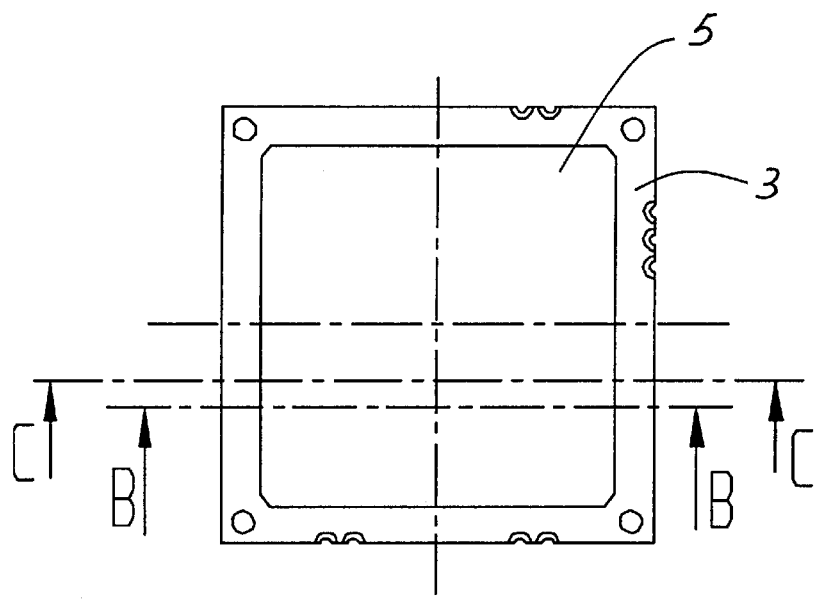

As shown in FIG. 1A the YIG oscillator 1 in one embodiment thereof comprises an interface circuit board 3, a metal enclosure 5 containing the vital oscillator parts and a first resilient means, here comprising a single resilient element, embodied as a rubber plate, 7 connecting the interface circuit board 3 with the enclosure 5. In other words, the interface circuit 3 resiliently supports, or suspends, the enclosure 5 by means of the rubber plate 7. Preferably the enclosure is of a material, such as magnetic iron, that constitutes a magnetic shield in order to protect the contents thereof from external magnetic fields.

When mounting the YIG oscillator in a device using its output frequency the interface circuit board 3 is mechanically fastened in the device, and electrically connected to the same. Preferably these are the only mechanical and electrical connections between the YIG oscillator 1 and the device.

Figure 1C:
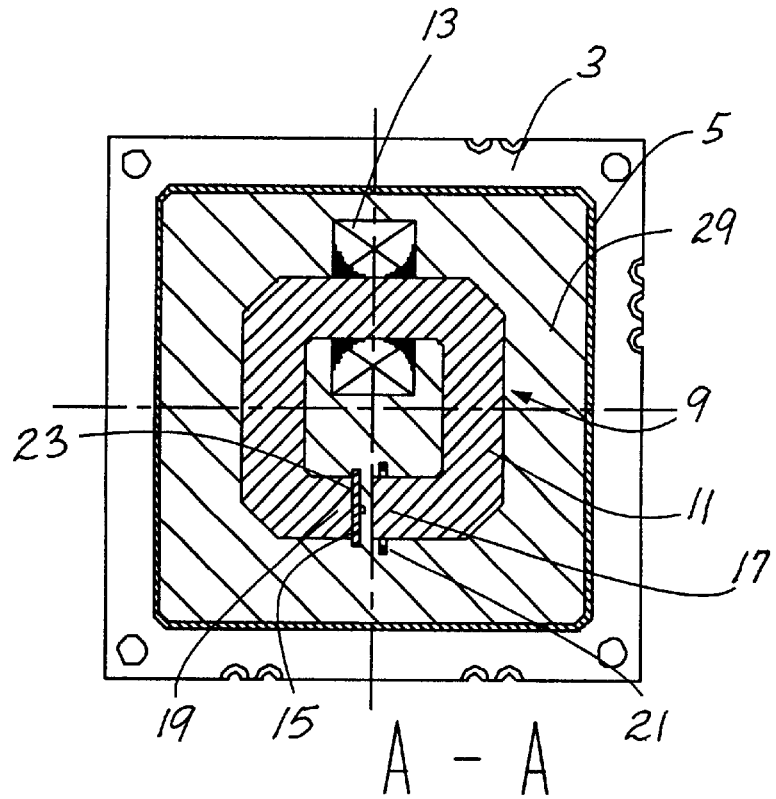
Figure 1D:
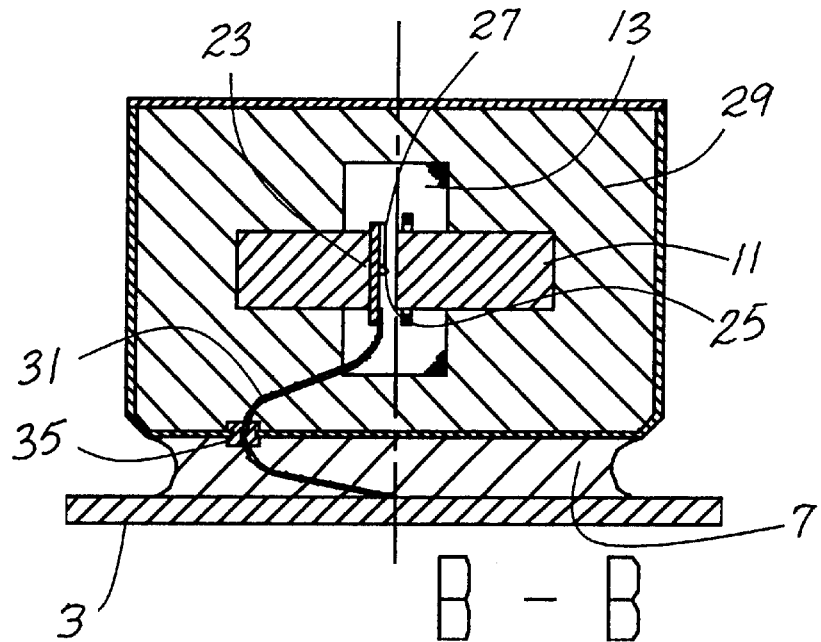
Figure 1E:
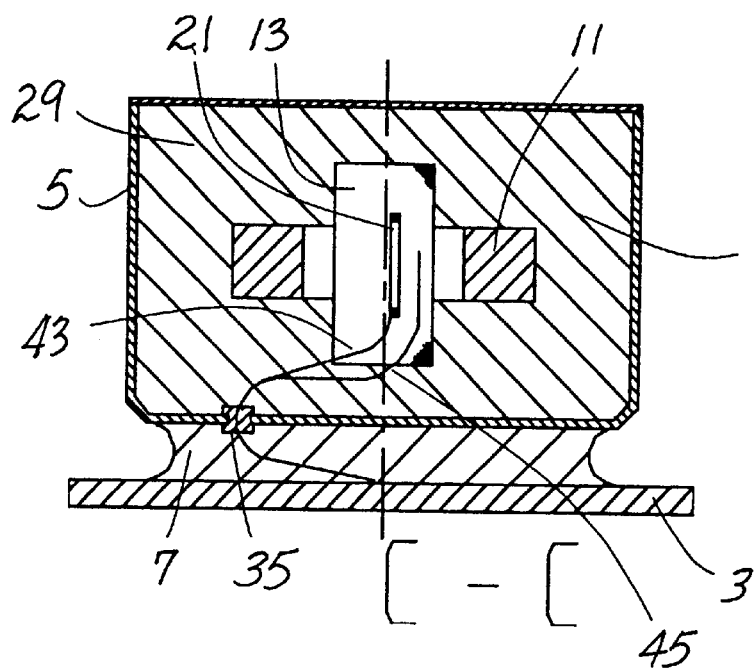

As shown in FIGS. 1C–1E the YIG oscillator 1 further comprises a magnetic structure 9, having an iron core 11, which preferably is ring shaped, and a ring shaped main coil 13 encircling the iron core 11 at a portion thereof, said magnetic structure 9 being enclosed by the enclosure 5. When energized the main coil 13 generates a magnetic flux through the iron core 11. An air gap 15 is formed in the iron core 11 and is defined by first and second iron core ends 17, 19. At the first end 17 thereof an fm coil 21 is arranged for providing fine tuning of he magnetic field through the air gap 15. An oscillator circuit board 23 is attached to the second iron core end 19 and carries, via a support rod 27, a YIG resonator, and more particularly a ferrite crystal, 25 positioned in the air gap 15. For example, the oscillator circuit board 23 can be adhered to the second end 19 of the iron core 11. The ferrite crystal generates an output frequency, which is related to the magnetic flux density of the air gap 15.

Additionally, the YIG oscillator comprises a second resilient means, here comprising a single resilient element, 29, resiliently supporting the magnetic structure 9, and a flexible circuit 31 connecting the oscillator circuit board 23 with the interface circuit board 3. Thus, the second resilient means 29 suspends the magnetic structure, and thereby also the oscillator circuit board 23. Said second resilient means 29 in this embodiment is embodied as a rubber block, which embeds the magnetic structure 9 and a part of the flexible circuit 31. Said rubber block 29 substantially fills the interior of the enclosure 5. Hence, the magnetic structure 9 needs no other kind of support in excess of the rubber block 29 but is allowed to float freely in relation to the enclosure 5. This results in a YIG oscillator having a substantially reduced Vibration Sensitivity compared to corresponding prior art YIG oscillators while keeping the size of the YIG oscillator advantageously small. The flexible circuit 31 has an excessive length in order to permit mutual movement between the interface circuit board 3 and the oscillator circuit board 23.

Said rubber plate 7 contributes to the robustness of the YIG oscillator by suspending the whole enclosure 5 with its contents. As will be described below, by choosing appropriate properties for the rubber used a very effective filtering off of mechanical vibrations can be obtained.

The flexible circuit 31 extends through a hole of a sealing element 35 arranged in and sealing an aperture 33 of the enclosure 5.

Figure 1F:
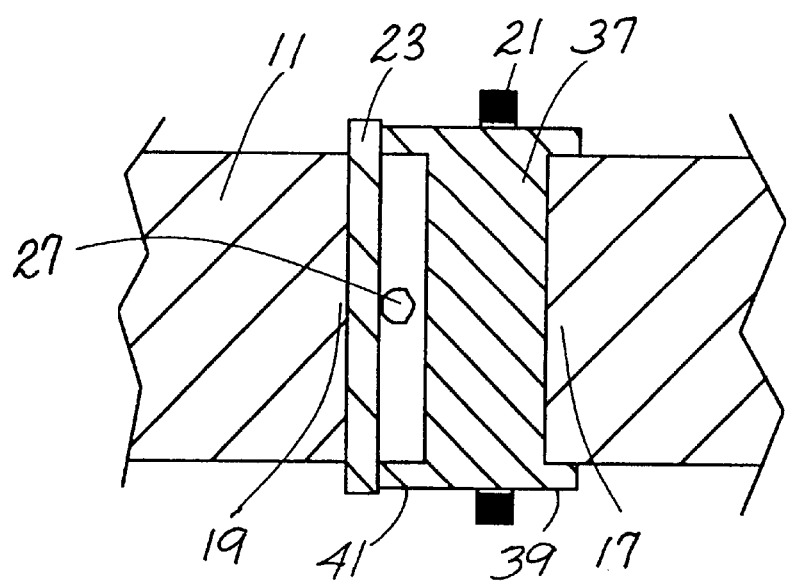
Figure 2A:
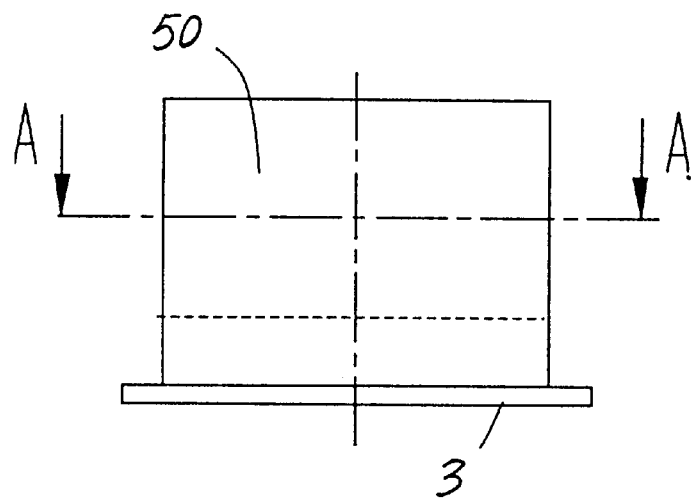
FIGS. 2A–2D schematically shows another embodiment of the YIG oscillator according to the present invention, wherein the views of these figures are similar to the views of FIGS. 1A–1D.
Figure 2B:
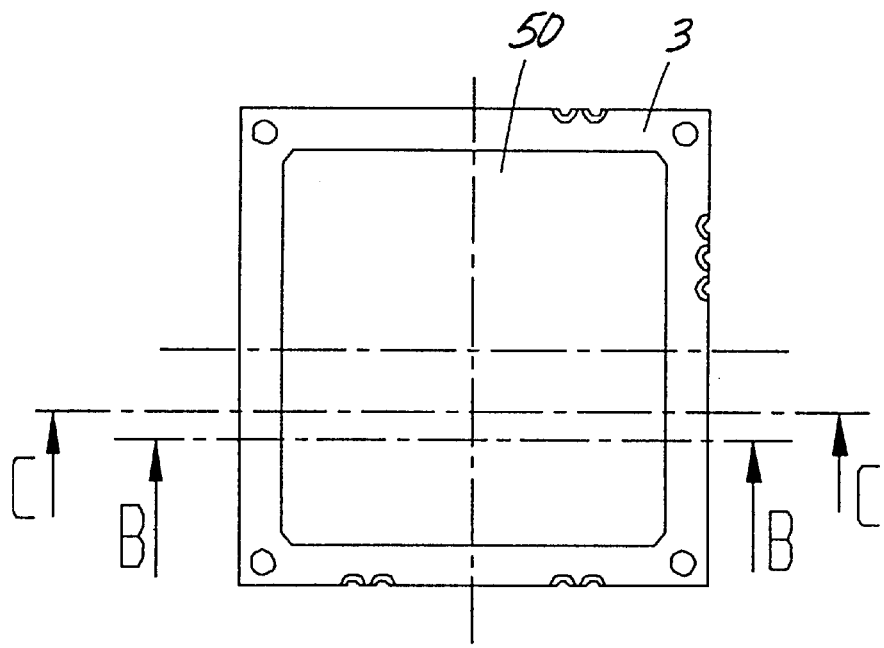
Figure 2C:
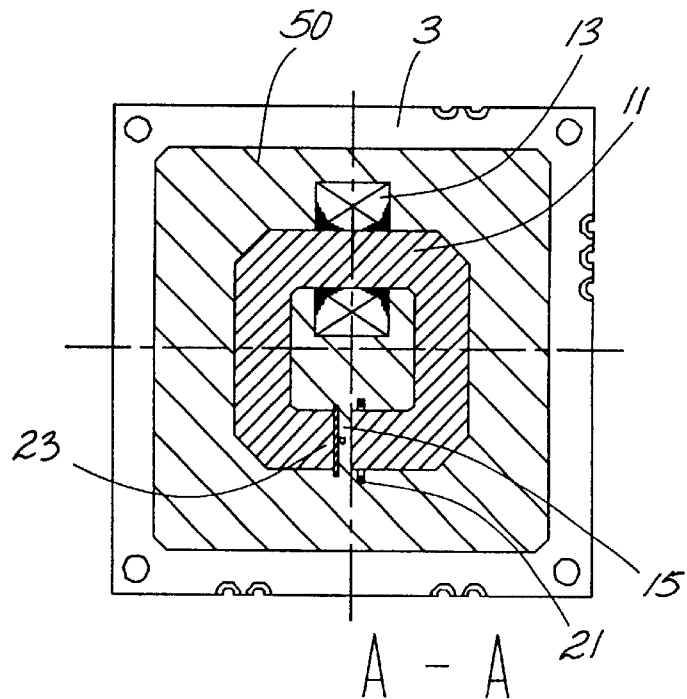
Figure 2D:
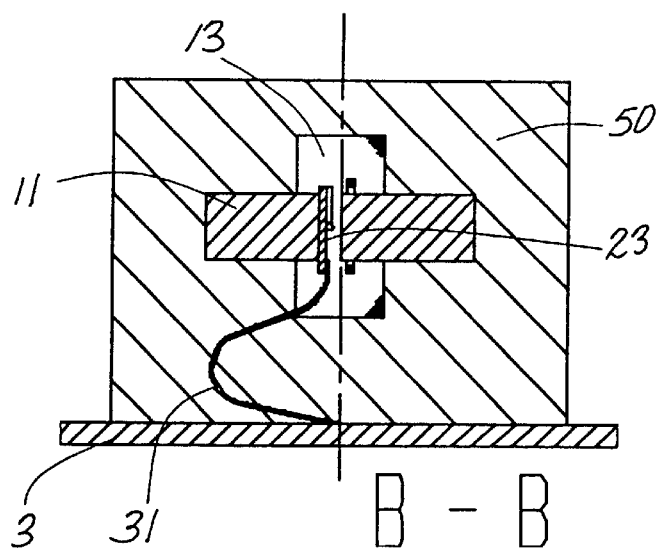

A ceramic spacer 37 is arranged at the air gap 15 of said magnetic structure 9 and fixes the first end 17 of the iron core 11 in relation to the second end 19 of the iron ore 11. More particularly, as shown in FIG. 1F, the ceramic spacer 37 at one end thereof has a collar 39 protruding over a portion of the first end 17 of the iron core 11, and at the other end thereof has a similar collar 41, which engages the surface of the oscillator circuit board 23. Between said other end of the ceramic spacer 37 and the oscillator circuit board 23, due to said collar, a space is formed within which the ferrite crystal 25, which is also called a YIG sphere, is positioned. Thereby the spacer 37 has the function of a lid or a capsule for the YIG crystal 25, which also facilitates the embedding operation. The FM coil 21 is preferably attached to the ceramic spacer 37, near the first end of the iron core 11. The FM coil 21 extends circumferentially of said ceramic spacer 37.

In this way the distance between the ends 17, 19 of the iron core is fixed, which also contributes to the overall vibrational robustness of the YIG oscillator 1. Otherwise, when the oscillator is subject to mechanical vibrations, there is a liability to mutual movement of the ends 17, 19 of the iron core 11 causing the above discussed problems of a varying length of the air gap 15.

Said coils 13 and 21 are supplied via a respective conductor 43, 45 also extending through the sealer 35 between the coils 13, 21 and the interface circuit board 3, which comprises terminals for the connection of external energy sources.

Said rubber plate 7 embeds the portion of the flexible circuit 31 and the leads 43, 45 respectively that extends between the enclosure 5 and the interface circuit board 3.

In a preferred embodiment the flexible circuit 31 comprises transmission leads embodied as a coplanar waveguide. By embedding the flexible circuit 31 the rubber block 29 and rubber plate 7 are contributing to the characteristic impedance of transmission lines of the coplanar waveguide, as explained above. Of course there is a contribution also to the characteristic impedance of other microwave transmission line structures, such as a microstrip line, but in case of a waveguide the contribution is substantial.

Figure 3:
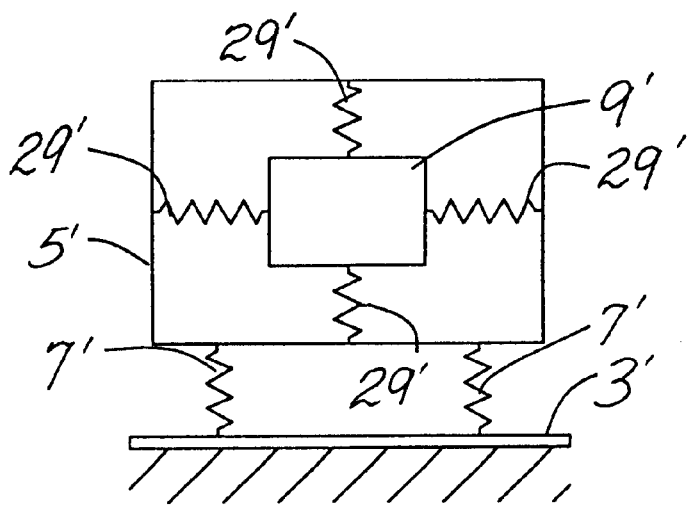
FIG. 3 schematically illustrates the principal suspension of the YIG oscillator.
Figure 4:
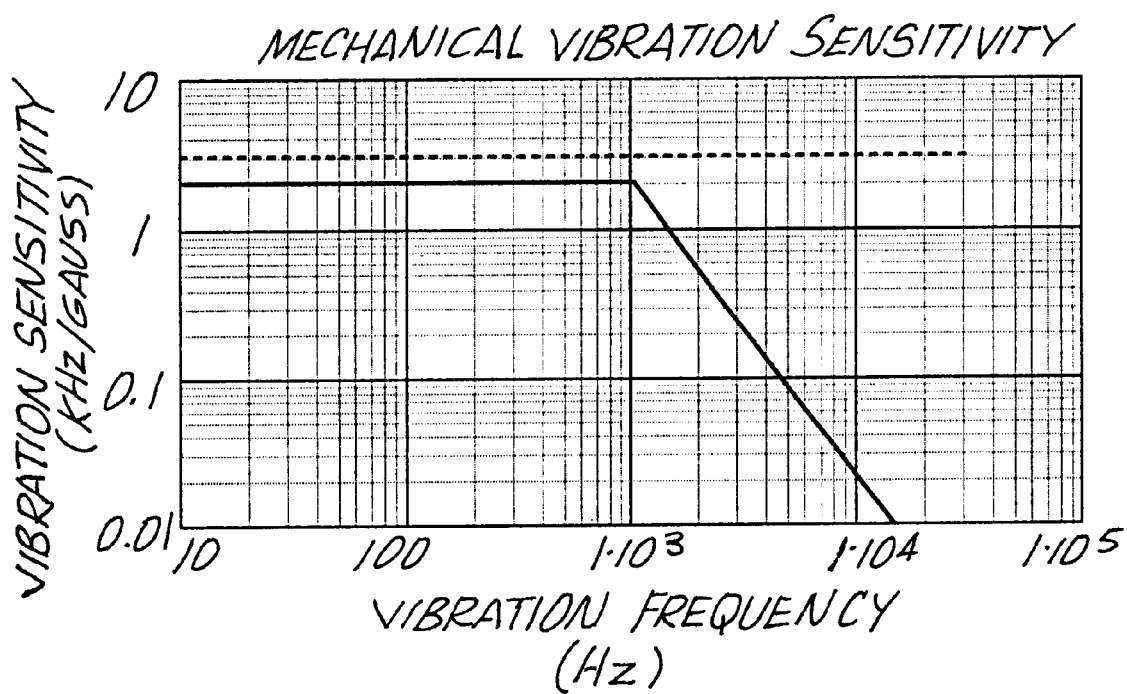
FIG. 4 illustrates an example of a filter characteristic of the mechanical filter, which is obtained with YIG oscillator structure.

The resilient means 7 and 29, in conjunction with the masses supported thereby, form a mechanical filter system as principally illustrated in FIG. 3. More specifically the filter system can be considered as containing two mechanical filters. A first mechanical filter is embodied by the rubber block 29, represented by springs 29' in FIG. 3, in conjunction with the magnetic structure 9, represented by a box 9' in FIG. 3. A second mechanical filter is embodied by the rubber plate 7, represented by springs 7' in FIG. 3, in conjunction with the enclosure 5, represented by 5' in FIG. 3, and its contents. These first and second filters can be designed with desired filter characteristics on basis of an intended application. Such a mechanical vibration filter is characterized by a resonance frequency, ideally critically damped, and an increased attenuation above the resonance frequency in the order of 40 dB/decade. In FIG. 4 obtainable values of these characteristics are shown. In the example of FIG. 4 the properties of the rubber materials are chosen such as to provide a lower resonance frequency for the outer mechanical filter system and a higher resonance frequency for the inner mechanical filter system. As understood by a man skilled in the art of course there are practical limits for the filter characteristics, but the operative range is very wide.

Another embodiment of the YIG oscillator is shown in FIGS. 2A–2D. In this embodiment the enclosure described above is omitted. Consequently some modifications have been made to the resilient means. The parts which correspond to the above-described parts of the embodiment of FIGS. 1A–1F have been given the same referentials and will not be separately described in conjunction with FIGS. 2A–2D. What primarily differs between this embodiment having no enclosure that separates the interface circuit board 3 from the magnetic structure 9 is the structure of the resilient means, in FIGS. 2A–D denoted 50. In this embodiment the resilient means 50 is a single block shaped resilient element. The resilient element 50 is made of a polymer, preferably rubber, and embeds the magnetic structure 9, and the flexible circuit 31, which extends between the oscillator circuit board 23 and the interface circuit board 3. Thus, like the second resilient element 29 described above the resilient element 50 suspends the magnetic structure, but unlike the resilient element 29 the resilient element 50 is directly attached to the interface circuit board 3. This embodiment having no enclosure is suitable for applications where the YIG oscillator is mounted in an apparatus, i.e. the interface circuit board is fastened in some support of the apparatus, having an outer cover enclosing the whole YIG oscillator. Alternatively, if necessary, the YIG oscillator as a whole can be encapsulated.

Figure 5:
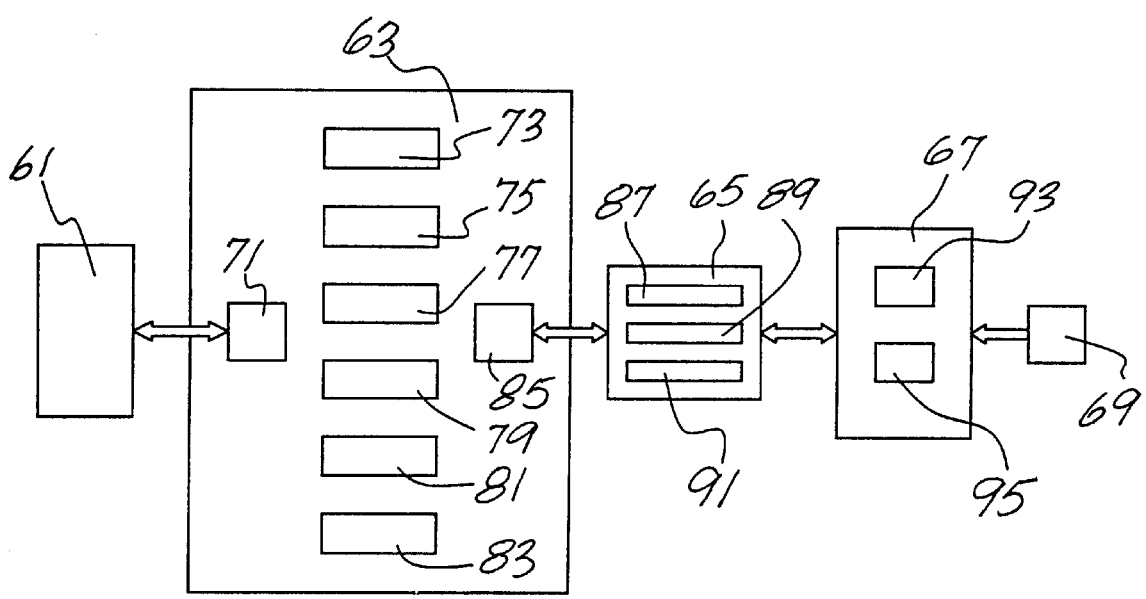
FIG. 5 shows a schematic block diagram of circuitry of the YIG oscillator.

In accordance with the present invention a separate interface circuit board 3 is provided, where circuitry for communicating with external devices and for power supply to the YIG oscillator are arranged. The oscillator circuit board 23 comprises a minimum of circuitry and essential signal transmission between the interface circuit board 3 and the oscillator circuit board 23 is performed via the flexible circuit. FIG. 5 shows a schematic block diagram representing circuitry typically arranged in different parts of the YIG oscillator. Said circuitry comprises external circuitry 61, circuitry of the interface circuit board 63, the flexible circuit 65, circuitry of the oscillator circuit board 67, and the ferrite crystal 69. The external circuitry 61 is connected to first terminals 71 on the interface circuit board 63, which first terminals are for external connections. The interface circuit board comprises a voltage regulator 73, active oscillator bias circuitry 75, a first amplifier bias network 77, attenuators 79 a second amplifier 81 and a microwave low pass filter 83. Further second terminals 85 are arranged on the interface circuit board 3 for connection with the flexible circuit 65. The flexible circuit 65 comprises a coplanar waveguide 87, a line for a first amplifier bias signal 89 and a line for a controlled oscillator bias signal 91, which are connected to the oscillator circuit board 67. The oscillator circuit board 67 is connected to the ferrite crystal for receiving an output frequency and comprises oscillating circuitry 93 and a first microwave amplifier 95. Since said circuitry arranged on the interface circuit board 3, the flexible circuit 65 and the oscillator circuit board 23 is known per se, it is evident to a man skilled in the art how to connect the circuitry in order to obtain an operating YIG oscillator. Hence, no further description as to how said circuitry is interconnected will be made.

Above preferred embodiments of the YIG oscillator according to the present invention have been described. These should be seen as merely non-limiting examples. Many modifications will be possible within the scope of the invention as defined by the claims. Below a few examples of such modifications will be given.

As briefly indicated above the resilient means need not be made of a polymer, but several alternative implementations are possible. For example conventional springs can be arranged. However the above-described advantages obtained by embedding the magnetic structure, at least to a certain extent, will be lost when using springs. A combination of different types of resilient elements is also possible.

What is claimed is:

1. A YIG oscillator comprising a magnetic structure; an oscillator circuit board attached to said magnetic structure and carrying a YIG resonator positioned in an air gap of said magnetic structure; an interface circuit board comprising terminals for external connections, said interface circuit board supporting said magnetic structure by means of a resilient means attached to said interface circuit board; and a flexible circuit connected at one end to the oscillator circuit board and connected at the other end to the interface circuit board.

2. A YIG oscillator according to claim 1, said resilient means comprising at least one resilient element consisting of a polymer.

3. A YIG oscillator according to claim 2, said at least one resilient element consisting of a polymer embedding at least a portion of said flexible circuit.

4. A YIG oscillator according to claim 3, said flexible circuit comprising a coplanar waveguide.

5. A YIG oscillator according to claim 2, said at least one resilient element consisting of a polymer embedding at least a portion of said magnetic structure.

6. A YIG oscillator according to claim 1, said resilient means comprising at least one spring element.

7. A YIG oscillator according to claim 3, said polymer embedding at least a portion of said flexible circuit being arranged to contribute to the characteristic impedance of a transmission line on the flexible circuit.

8. A YIG oscillator according to claim 1, said resilient means forming, in conjunction with said magnetic circuit, a mechanical vibration filter.

9. A YIG oscillator according to claim 1, further comprising a ceramic spacer arranged at the air gap of the magnetic structure and fixing, mutually, two portions of the magnetic structure defining said air gap.

10. A YIG oscillator comprising an enclosure, a magnetic structure; an oscillator circuit board attached to said magnetic structure and carrying a YIG resonator positioned in an air gap of said magnetic structure; and an interface circuit board comprising terminals for external connections; said magnetic structure and said oscillator circuit board being enclosed by said enclosure, said interface circuit board supporting said enclosure, wherein said YIG oscillator further comprises a flexible circuit, extending through said enclosure and interconnecting said oscillator circuit board with said interface circuit board; and a resilient means comprising a resilient element enclosed by and attached to said enclosure and supporting said magnetic structure.

11. A YIG oscillator according to claim 10, said resilient means comprising a further resilient element, said interface circuit board supporting said enclosure by means of said further resilient element.

12. A YIG oscillator according to claim 10, wherein said enclosure provides a magnetic shielding.

13. A YIG oscillator according to claim 11, said resilient element forming, in conjunction with said magnetic structure, a first mechanical vibration filter having a first filter characteristic, and said further resilient element forming, in conjunction with said enclosure and its consistence, a second mechanical vibration filter having a second filter characteristic.

14. A YIG oscillator according to claim 10, said resilient means comprising at least one resilient element consisting of a polymer.

15. A YIG oscillator according to claim 14, said at least one resilient element consisting of a polymer embedding at least a portion of said flexible circuit.

16. A YIG oscillator according to claim 14, said at least one resilient element consisting of a polymer embedding at least a portion of said magnetic structure.

17. A YIG oscillator according to claim 10, further comprising a ceramic spacer arranged at the air gap of said magnetic structure and fixing, mutually, two portions of said magnetic structure defining said air gap.

* * * * *